United States Patent
Yi et al.

(10) Patent No.: US 11,943,920 B2
(45) Date of Patent: Mar. 26, 2024

(54) SPLIT GATE MEMORY WITH CONTROL GATE HAVING NONPLANAR TOP SURFACE

(71) Applicant: UNITED MICROELECTRONICS CORP., Hsin-Chu (TW)

(72) Inventors: Liang Yi, Singapore (SG); Zhiguo Li, Singapore (SG); Chi Ren, Singapore (SG); Xiaojuan Gao, Singapore (SG); Boon Keat Toh, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/468,637

(22) Filed: Sep. 7, 2021

(65) Prior Publication Data
US 2023/0045722 A1 Feb. 9, 2023

(30) Foreign Application Priority Data

Aug. 3, 2021 (CN) .......................... 202110886177.6

(51) Int. Cl.
| | |
|---|---|
| H01L 27/11531 | (2017.01) |
| H01L 21/28 | (2006.01) |
| H01L 27/11573 | (2017.01) |
| H01L 29/423 | (2006.01) |
| H01L 29/66 | (2006.01) |
| H01L 29/78 | (2006.01) |
| H01L 29/788 | (2006.01) |
| H01L 29/792 | (2006.01) |

(Continued)

(52) U.S. Cl.
CPC ........ *H10B 41/42* (2023.02); *H01L 29/40114* (2019.08); *H01L 29/40117* (2019.08); *H01L 29/42328* (2013.01); *H01L 29/42344* (2013.01); *H01L 29/66795* (2013.01); *H01L 29/66825* (2013.01); *H01L 29/66833* (2013.01); *H01L 29/7851* (2013.01); *H01L 29/7881* (2013.01); *H01L 29/792* (2013.01); *H10B 43/40* (2023.02)

(58) Field of Classification Search
CPC ...................... H01L 27/11531; G11C 16/0425
See application file for complete search history.

(56) References Cited

U.S. PATENT DOCUMENTS

| | | |
|---|---|---|
| 10,693,018 B2 | 6/2020 | Shu |
| 10,707,223 B2 | 7/2020 | Narumi |

(Continued)

FOREIGN PATENT DOCUMENTS

| | | | |
|---|---|---|---|
| FR | 3023408 A1 | * | 1/2016 |
| JP | 2009010035 A | * | 1/2009 |

*Primary Examiner* — Peter Bradford
(74) *Attorney, Agent, or Firm* — Winston Hsu

(57) ABSTRACT

A semiconductor memory device includes a semiconductor substrate, a select gate on the semiconductor substrate, a control gate disposed adjacent to the select gate and having a first sidewall and a second sidewall, and a charge storage layer between the control gate and the semiconductor substrate. The control gate includes a third sidewall close to the second sidewall of the select gate, a fourth sidewall opposite to the third sidewall, and a non-planar top surface between the third sidewall and the fourth sidewall. The non-planar top surface includes a first surface region that descends from the third sidewall to the fourth sidewall. The charge storage layer extends to the second sidewall of the select gate.

18 Claims, 14 Drawing Sheets

(51) Int. Cl.
*H10B 41/42* (2023.01)
*H10B 43/40* (2023.01)

(56) References Cited

U.S. PATENT DOCUMENTS

| | | | |
|---|---|---|---|
| 2012/0068243 A1* | 3/2012 | Kawashima | H01L 29/42344 |
| | | | 257/E21.422 |
| 2016/0099153 A1* | 4/2016 | Swift | H01L 29/40114 |
| | | | 257/326 |
| 2016/0233228 A1* | 8/2016 | Chuang | H10B 41/47 |
| 2017/0062440 A1* | 3/2017 | Arigane | H01L 27/11573 |
| 2017/0186763 A1* | 6/2017 | Mihara | H01L 29/7923 |
| 2018/0097008 A1* | 4/2018 | Hayashi | H01L 29/42344 |

* cited by examiner

SPLIT GATE MEMORY WITH CONTROL GATE HAVING NONPLANAR TOP SURFACE

BACKGROUND OF THE INVENTION

1. Field of the Invention

The present invention relates to the field of semiconductor technology, in particular to an improved semiconductor non-volatile memory device.

2. Description of the Prior Art

A non-volatile memory, such as flash memory, retains stored data even if power to the memory is removed. A non-volatile memory cell stores data, for example, by storing electrical charge in an electrically isolated memory gate or in a charge-trapping layer underlying a control gate of a field-effect transistor (FET). The stored electrical charge controls the threshold of the FET, thereby controlling the memory state of the cell.

A non-volatile memory cell is programmed using, for example, hot carrier injection to place charge into a storage layer. High drain and gate voltages are used to facilitate the programming process, and the memory cell conducts relatively high current during programming, which can be undesirable in low voltage or low power application.

A split-gate memory cell is a type of non-volatile memory cell, in which a select gate is placed adjacent a memory gate. During programming of a split-gate memory cell, the select gate is biased at a relatively low voltage, and only the memory gate is biased at the high voltage to provide the vertical electric field necessary for hot-carrier injection. Since acceleration of the carriers takes place in the channel region mostly under the select gate, the relatively low voltage on the select gate results in more efficient carrier acceleration in the horizontal direction compared to a conventional flash memory cell. That makes hot-carrier injection more efficient with lower current and lower power consumption during a programming operation.

One disadvantage of the prior art is that the select gate and control gate of the split gate memory cell need to be defined by lithography and etching processes respectively, which easily leads to overlay shift and insufficient memory read/write operation margin.

SUMMARY OF THE INVENTION

It is one object of the present invention to provide a semiconductor memory device to solve the above-mentioned shortcomings or deficiencies of the prior art.

One aspect of the invention provides a semiconductor memory device including a semiconductor substrate and a select gate disposed on the semiconductor substrate. The select gate includes a first sidewall and a second sidewall opposite to the first sidewall. A control gate is disposed on the semiconductor substrate and in proximity to the second sidewall of the select gate. The control gate includes a third sidewall in proximity to the second sidewall, a fourth sidewall opposite to the third sidewall, and a non-planar top surface between the third sidewall and the fourth sidewall. The non-planar top surface includes a first surface region descending from the third sidewall to the fourth sidewall. A charge storage layer is disposed between the control gate and the semiconductor substrate. The charge storage layer extends onto the second sidewall.

According to some embodiments, the substrate comprises a fin structure extending along a first direction.

According to some embodiments, the select gate extends along a second direction and crosses over the fin structure.

According to some embodiments, the control gate extends along the second direction and crosses over the fin structure.

According to some embodiments, the non-planar top surface further comprises a second surface region between the first surface region and the fourth sidewall, wherein a slope of the second surface region is greater than that of the first surface region.

According to some embodiments, the non-planar top surface further comprises a third surface region connecting the second surface region with the fourth sidewall, wherein the second surface region, the third surface region and the fourth sidewall constitute a step structure.

According to some embodiments, the third surface region is lower than the first surface region and the second surface region.

According to some embodiments, the select gate is a polysilicon electrode.

According to some embodiments, the control gate is a polysilicon electrode

According to some embodiments, the charge storage layer is an oxide-nitride-oxide (ONO) layer.

Another aspect of the invention provides a method for forming a semiconductor memory device. A semiconductor substrate is provided. A select gate is formed on the semiconductor substrate. The select gate includes a first sidewall and a second sidewall opposite to the first sidewall. A control gate is formed in a self-aligned manner on the semiconductor substrate and in proximity to the second sidewall of the select gate. The control gate includes a third sidewall in proximity to the second sidewall, a fourth sidewall opposite to the third sidewall, and a non-planar top surface between the third sidewall and the fourth sidewall. The non-planar top surface includes a first surface region descending from the third sidewall to the fourth sidewall. A charge storage layer is formed between the control gate and the semiconductor substrate. The charge storage layer extends onto the second sidewall.

According to some embodiments, the substrate comprises a fin structure extending along a first direction.

According to some embodiments, the select gate extends along a second direction and crosses over the fin structure.

According to some embodiments, the control gate extends along the second direction and crosses over the fin structure.

According to some embodiments, the non-planar top surface further comprises a second surface region between the first surface region and the fourth sidewall, wherein a slope of the second surface region is greater than that of the first surface region.

According to some embodiments, the non-planar top surface further comprises a third surface region connecting the second surface region with the fourth sidewall, wherein the second surface region, the third surface region and the fourth sidewall constitute a step structure.

According to some embodiments, the third surface region is lower than the first surface region and the second surface region.

According to some embodiments, the select gate is a polysilicon electrode.

According to some embodiments, the control gate is a polysilicon electrode.

According to some embodiments, the charge storage layer is an oxide-nitride-oxide (ONO) layer.

It is one technical feature of the present invention that the select gate is formed first, and then the charge storage layer is formed, and then the control gate is formed in a self-aligned manner. In this way, a photomask can be saved, cost is reduced, and the control gate is formed in a self-aligned manner, which can solve the problems of overlay shift and insufficient read/write operation margin of the memory.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
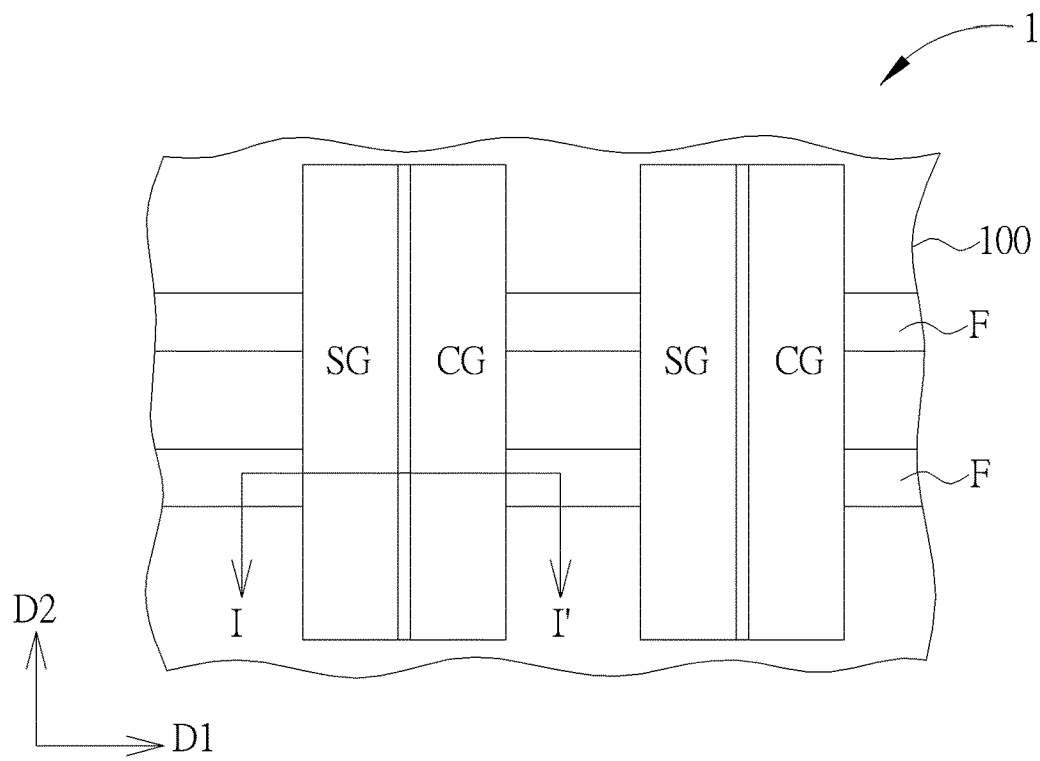
FIG. 1 is a schematic diagram of a partial layout of a semiconductor memory device according to an embodiment of the present invention.
Figure 2:
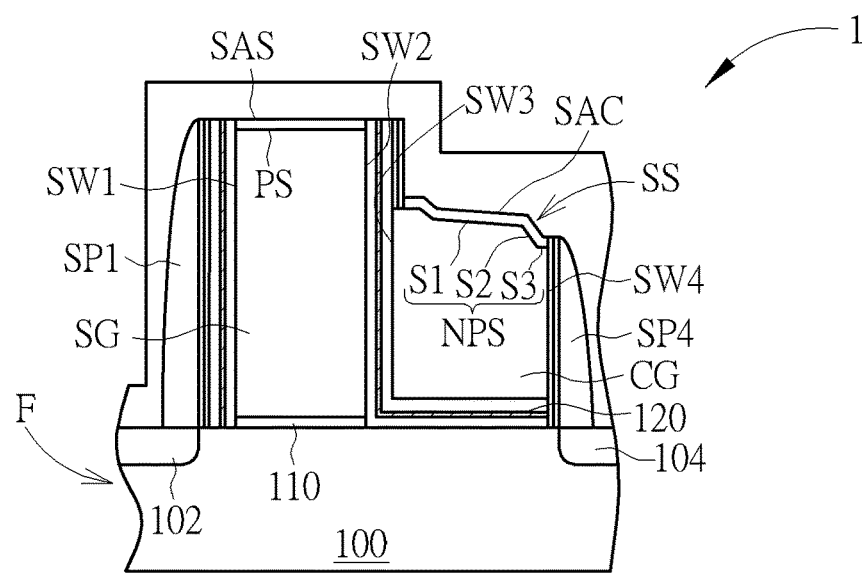
FIG. 2 is a cross-sectional view taken along line I-I' in FIG. 1.

Please refer to FIG. 1 and FIG. 2. FIG. 1 is a schematic diagram of a partial layout of a semiconductor memory device 1 according to an embodiment of the present invention, and FIG. 2 is a cross-sectional view taken along line I-I' in FIG. 1. The semiconductor memory device 1 may be a non-volatile memory, for example, a split-gate memory. As shown in FIG. 1, the semiconductor memory device 1 includes a semiconductor substrate 100, such as a silicon substrate, but is not limited thereto. A fin structure F extending along the first direction D1 is provided on the semiconductor substrate 100. In the second direction D2, the select gate SG and the control gate CG extend across the fin structure F. The select gate SG is adjacent to the control gate CG and at least one insulating layer is provided between the select gate SG and the control gate CG.

According to an embodiment of the present invention, the select gate SG is a polysilicon electrode. According to an embodiment of the present invention, the control gate CG is a polysilicon electrode.

As shown in FIG. 1 and FIG. 2, the semiconductor memory device 1 includes the select gate SG disposed on the fin structure F of the semiconductor substrate 100. The select gate SG includes a first sidewall SW1 and a second sidewall SW2 opposite to the first sidewall SW1. A flat top surface PS is disposed between the first sidewall SW1 and the second sidewall SW2. According to an embodiment of the present invention, a metal silicide layer SAS is formed on the flat top surface PS of the select gate SG.

As shown in FIG. 1 and FIG. 2, the semiconductor memory device 1 further includes a control gate CG disposed on the fin structure F of the semiconductor substrate 100 and adjacent to the second sidewall SW2 of the select gate SG. The control gate CG includes a third sidewall SW3 in proximity to the second sidewall SW2, a fourth sidewall SW4 opposite to the third sidewall SW3, and a non-planar top surface NPS between the third sidewall SW3 and the fourth sidewall SW4.

According to an embodiment of the present invention, the non-planar top surface NPS includes a first surface region S1 descending from the third sidewall SW3 to the fourth sidewall SW4, and a second surface region S2 located between the first surface region S1 and the fourth sidewall SW4. The slope of the second surface region S2 is greater than the slope of the first surface region S1.

According to an embodiment of the present invention, the non-planar top surface NPS further includes a third surface region S3 connecting the second surface region S2 and the fourth sidewall SW4. According to an embodiment of the present invention, the third surface region S3 is lower than the first surface region S1 and the second surface region S2. According to an embodiment of the present invention, the second surface region S2, the third surface region S3 and the fourth sidewall SW4 constitute a step structure SS. According to an embodiment of the present invention, a metal silicide layer SAC is formed on the non-planar top surface NPS of the control gate CG.

According to an embodiment of the present invention, the semiconductor memory device 1 further includes a charge storage layer 120 disposed between the control gate CG and the fin structure F of the semiconductor substrate 100. The charge storage layer 120 extends to the second sidewall SW2, and may protrude beyond the non-planar top surface NPS of the control gate CG. According to an embodiment of the present invention, the charge storage layer 120 directly contacts the metal silicide layer SAS on the flat top surface PS of the select gate SG. According to an embodiment of the present invention, the charge storage layer 120 is an oxide-nitride-oxide (ONO) layer.

According to an embodiment of the present invention, the semiconductor memory device 1 further includes a spacer SP1 disposed on the first sidewall SW1 of the select gate SG and a spacer SP4 disposed on the fourth sidewall SW4 of the control gate CG The spacer SP1 and the spacer SP4 may include silicon nitride, silicon oxide, silicon oxynitride, or the like, but are not limited thereto. In addition, a drain region 102 may be formed in the fin structure F near the spacer SP1, and a source region 104 may be formed in the fin structure F near the spacer SP4.

Figure 3:
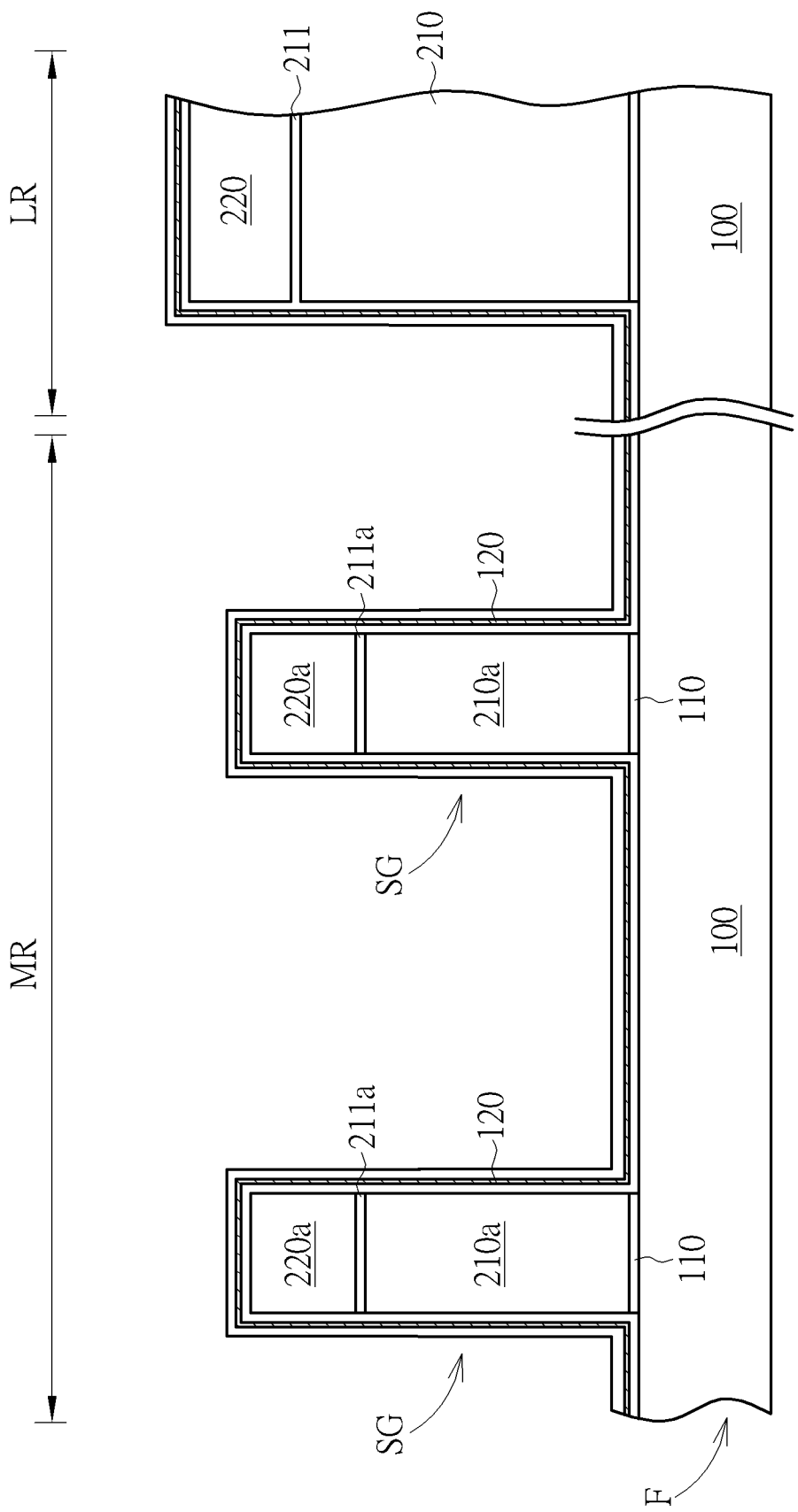
FIG. 3 to FIG. 15 illustrate a method of forming a semiconductor memory device according to an embodiment of the present invention.

Please refer to FIG. 3 to FIG. 15, which illustrate a method of forming a semiconductor memory device, in which the same regions, devices, layers or materials are designated by the same numeral numbers or labels. As shown in FIG. 3, a polysilicon layer 210, a silicon oxide layer 211, and a hard mask layer 220 are deposited in the memory region MR and the logic circuit region LR on the substrate 100. Lithography and etching processes are then performed to form select gates SG crossing the fin structure F in the memory region MR. At this point, the select gate SG includes a patterned polysilicon layer 210a, a patterned silicon oxide layer 211a, and a patterned hard mask layer 220a. According to an embodiment of the present invention, the thickness of the polysilicon layer 210a of the select gate SG is smaller than that of the polysilicon layer 210 in the logic circuit region LR. Subsequently, a charge storage layer 120, for example, an oxide-nitride-oxide (ONO) layer, is conformally deposited on the memory region MR and the logic circuit region LR.

Figure 4:
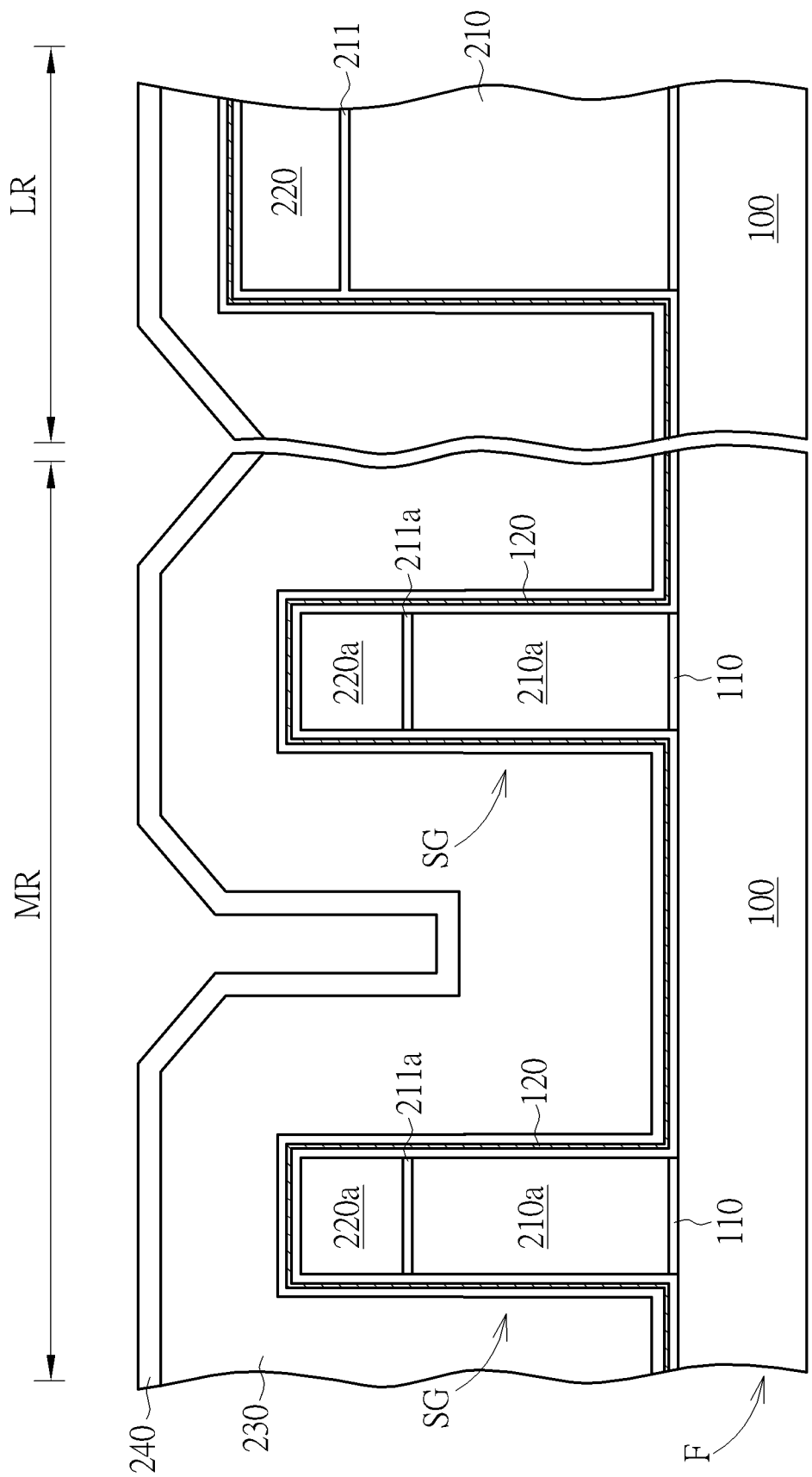

As shown in FIG. 4, next, a polysilicon layer 230 and a silicon oxide layer 240 are conformally deposited on the charge storage layer 120. According to an embodiment of the present invention, the polysilicon layer 230 and the silicon oxide layer 240 cover the memory region MR and the logic circuit region LR. According to an embodiment of the present invention, the polysilicon layer 230 does not completely fill the space between two adjacent select gates SG. According to an embodiment of the present invention, the thickness of the silicon oxide layer 240 may be about 80-120 angstroms, for example, 100 angstroms.

Figure 5:
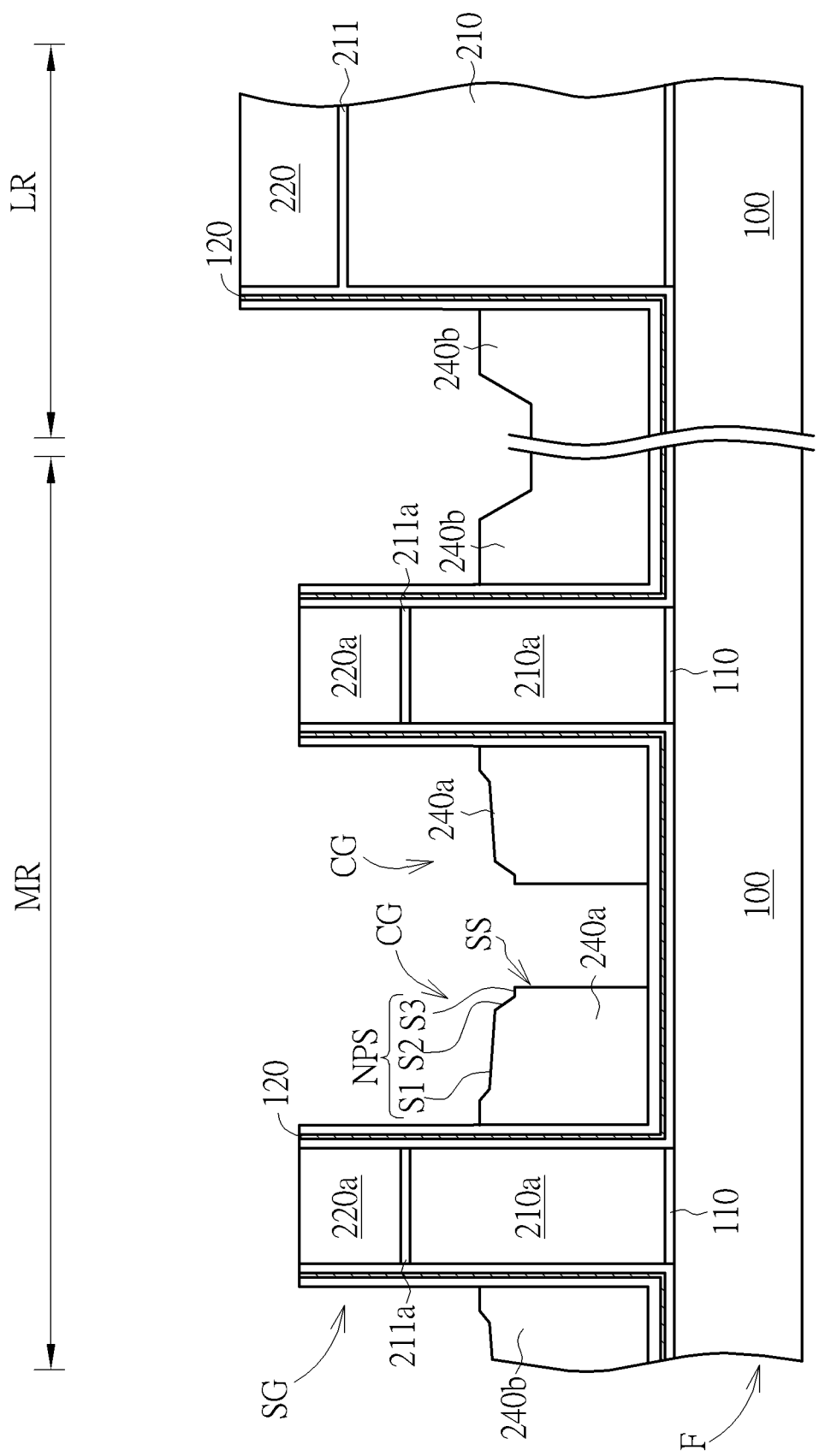

As shown in FIG. 5, a first self-aligned anisotropic dry etching process is performed. The silicon oxide layer 240 is first selectively etched to form spacers on the polysilicon layer 230. A second self-alignment is then performed. The polysilicon layer 230 is etched, thereby forming self-aligned polysilicon patterns 240a and 240b next to the select gate SG in the memory region MR. The polysilicon pattern 240a serves as the control gate CG of the semiconductor memory device. The second self-aligned anisotropic dry etching process is stopped when the surface of the charge storage layer 120 is revealed.

According to an embodiment of the present invention, the control gate CG includes a non-planar top surface NPS including a first surface region S1 and a second surface region S2. The slope of the second surface region S2 is greater than the slope of the first surface region S1. According to an embodiment of the present invention, the non-planar top surface NPS further includes a third surface region S3 connected to the second surface region S2. According to an embodiment of the present invention, the third surface region S3 is lower than the first surface region S1 and the second surface region S2. According to an embodiment of the present invention, the second surface region S2, the third surface region S3 and the sidewall of the control gate CG constitute a step structure SS.

Figure 6:
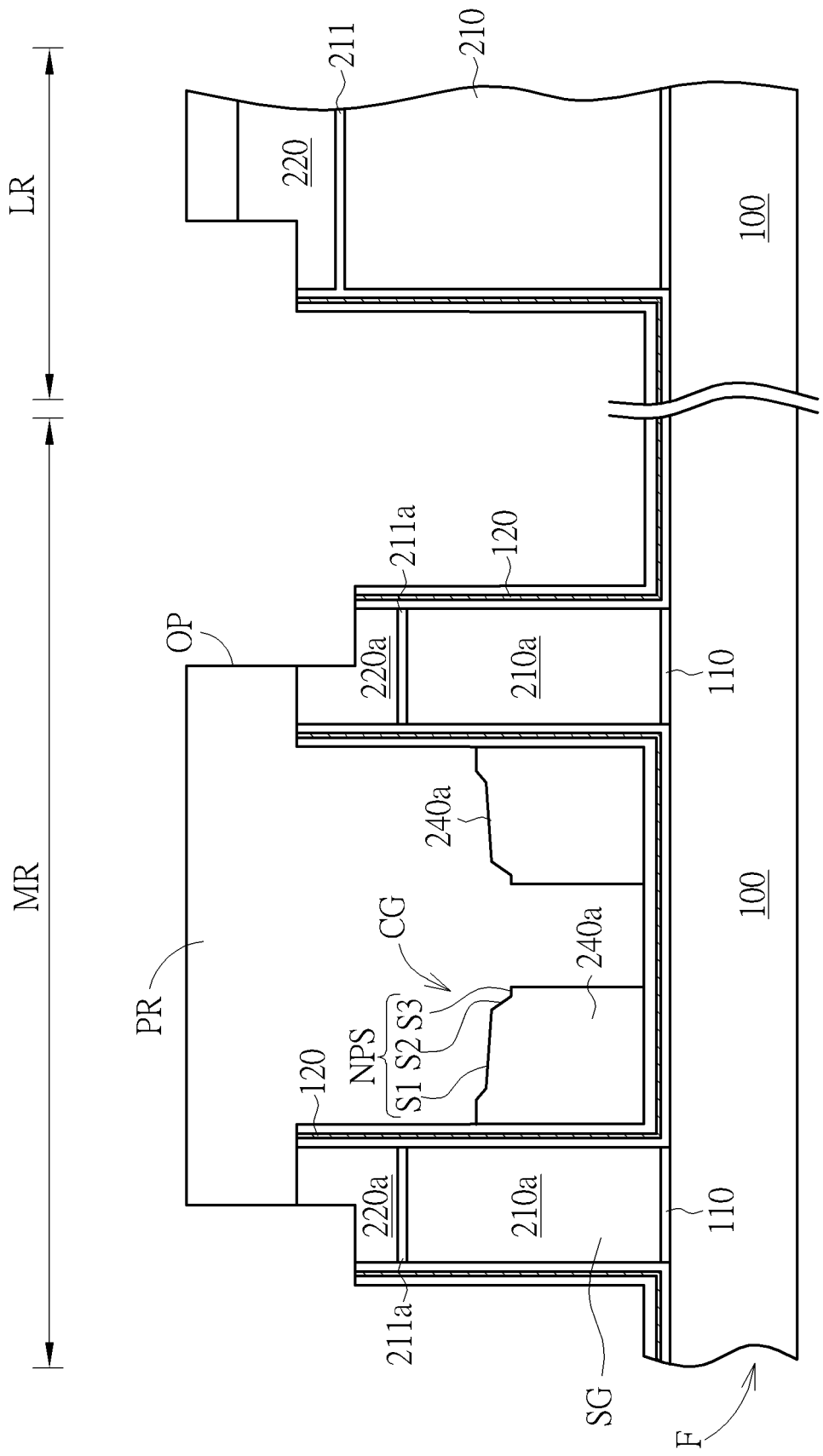

As shown in FIG. 6, next, a patterned photoresist layer PR is formed on the memory region MR and the logic circuit region LR, so that the patterned photoresist layer PR covers the control gate CG, while an opening OP of the patterned photoresist layer PR exposes the polysilicon pattern 240b opposite to the control gate CG. According to an embodiment of the present invention, the patterned photoresist layer PR may partially cover the select gate SG. Subsequently, an anisotropic dry etching process is performed, using the patterned photoresist layer PR and the hard mask layer 220a as an etching resist mask, to etch the exposed polysilicon pattern 240b until the underlying charge storage layer 120 is exposed.

Figure 7:
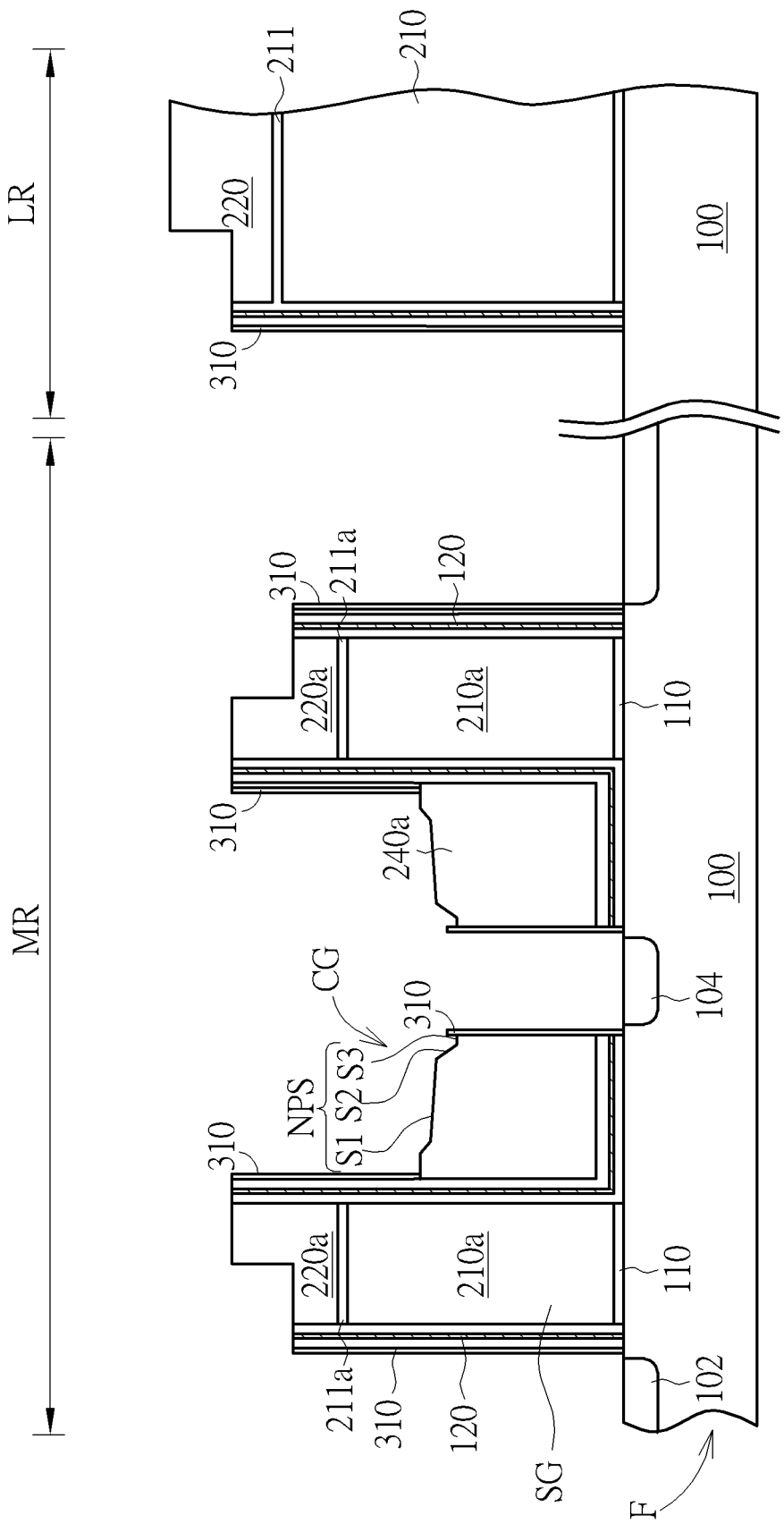

As shown in FIG. 7, the remaining patterned photoresist layer PR is removed, and a spacer layer, such as an oxide-nitride-oxide (ONO) layer, is formed on the memory region MR and the logic circuit region LR by using a chemical vapor deposition process. An anisotropic dry etching process is then performed to etch the spacer layer thereby forming spacers 310 on the sidewalls of the select gate SG and the control gate CG. An ion implantation process is then performed to form a drain region 102 and a source region 104 in the fin structure F adjacent to the spacers 310.

Figure 8:
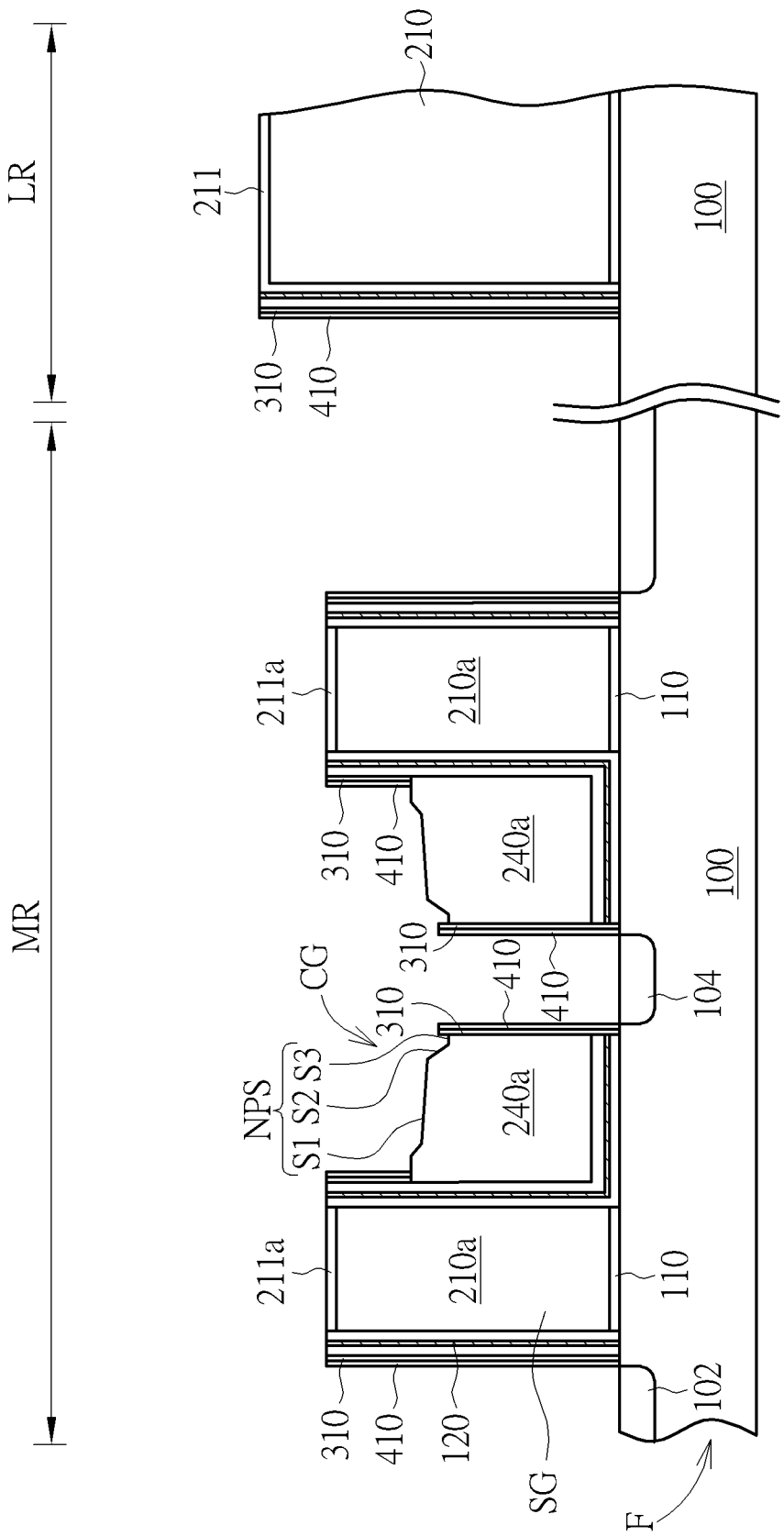

As shown in FIG. 8, the hard mask layer 220a of the select gate SG in the memory area MR and the hard mask layer 220 of the logic circuit area LR are removed so as to reveal the silicon oxide layer 211a in the memory area MR and the silicon oxide layer 211 in the logic circuit area LR. A chemical vapor deposition process is then performed to deposit a spacer layer, such as an oxide-nitride (ON) layer, on the memory region MR and the logic circuit region LR in a conformal manner. An anisotropic dry etching process is then performed to etch the spacer layer, thereby forming spacers 410 on the sidewalls of the select gate SG and the control gate CG.

Figure 9:
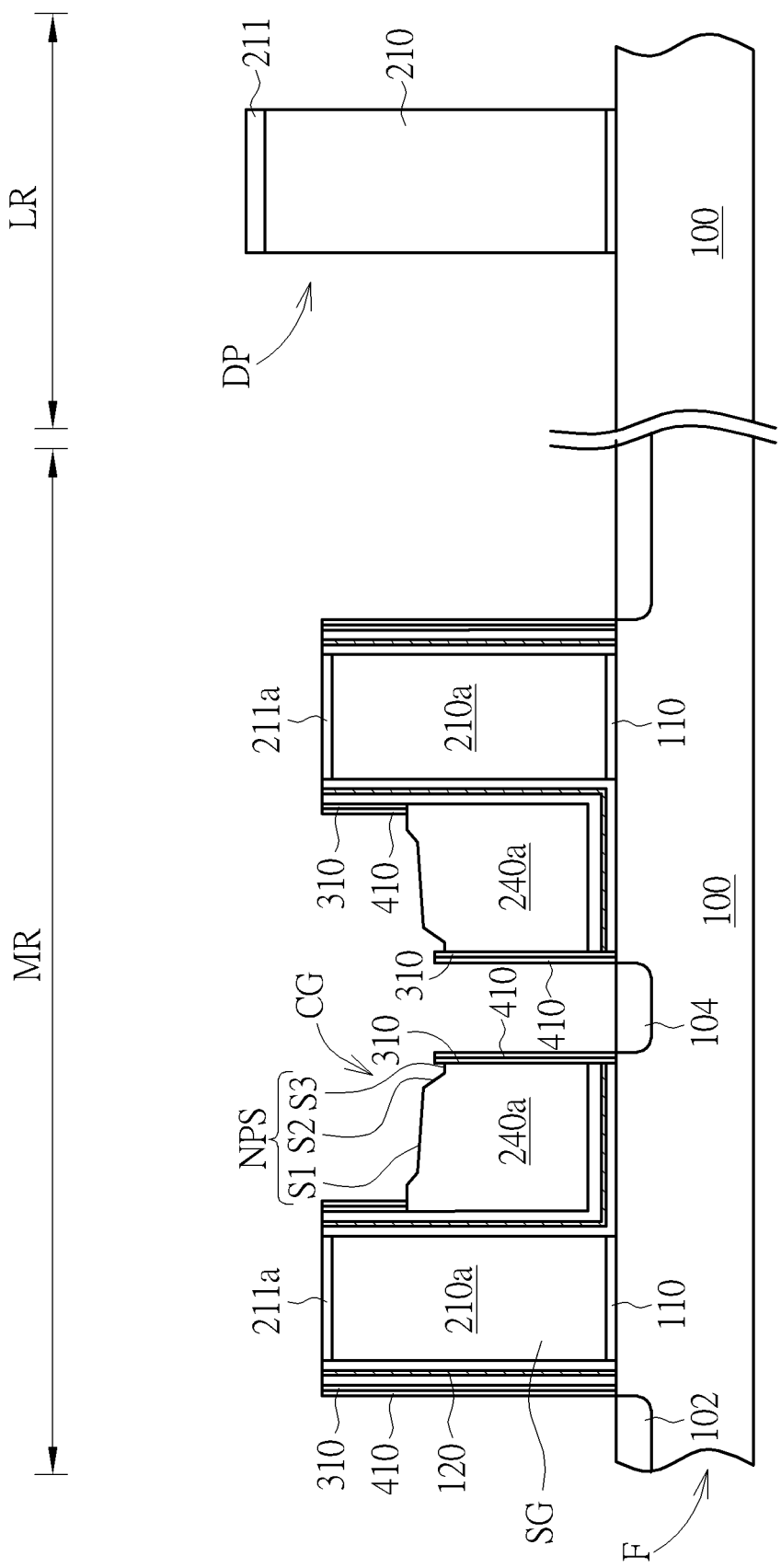

As shown in FIG. 9, a gate patterning process is performed in the logic circuit area LR, and the silicon oxide layer 211 and the polysilicon layer 210 in the logic circuit area LR are patterned into a dummy gate structure DP using lithography and etching processes.

Figure 10:
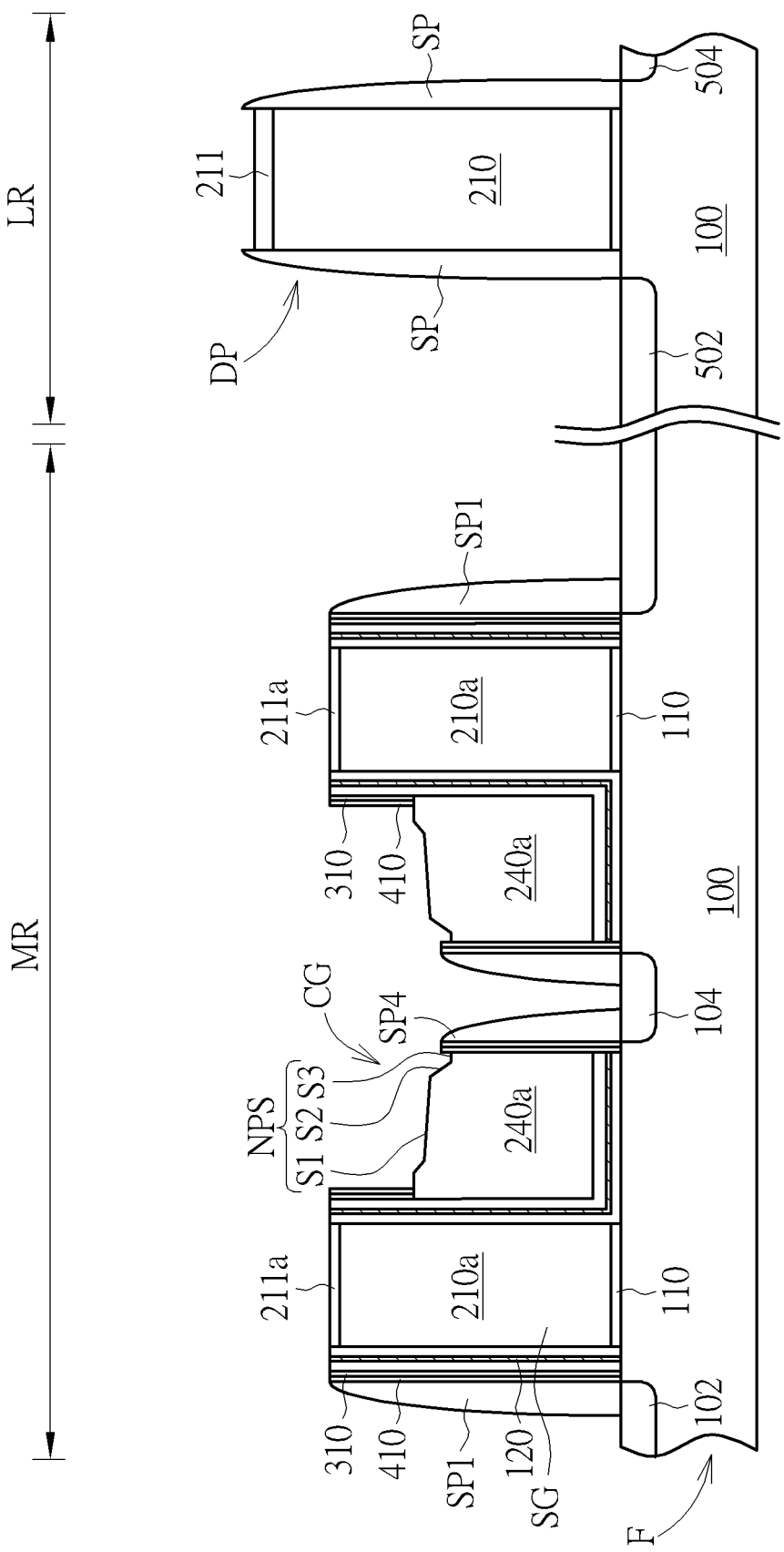

As shown in FIG. 10, a spacer layer, such as a silicon nitride layer, is conformally deposited on the memory region MR and the logic circuit region LR by using a chemical vapor deposition process. The spacer layer is then etched by an anisotropic dry etching process, thereby forming spacers on the sidewalls of the select gate SG and the control gate CG in the memory region MR, respectively, and spacers SP on the sidewalls of the dummy gate structure DP in the logic circuit region LR. According to an embodiment of the present invention, an ion implantation process is then performed to form doped regions 502 and 504 in the substrate 100 in the logic circuit region LR.

Figure 11:
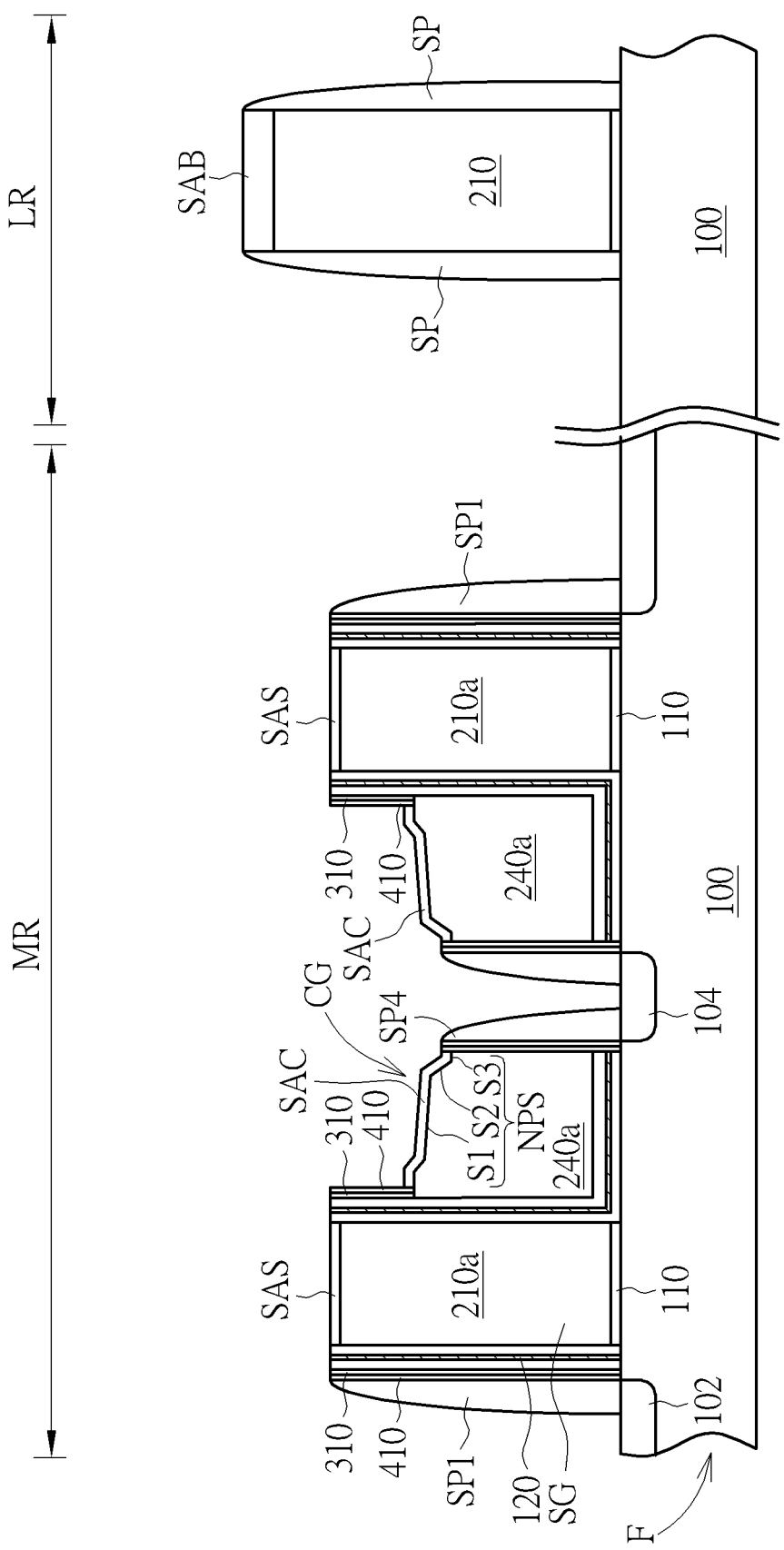

As shown in FIG. 11, a metal silicide process is then performed to form a metal silicide layer SAS on the select gate SG in the memory region MR, and a metal silicide layer SAC on the non-planar top surface NPS of the control gate CG. According to an embodiment of the present invention, the metal silicide layer SAS and the metal silicide layer SAC may include nickel silicide, titanium silicide, cobalt silicide, tungsten silicide, etc., but are not limited thereto. According to an embodiment of the present invention, a metal silicide block layer SAB can be formed on the part where the metal silicide layer is not required to be formed, for example, the dummy gate structure DP in the logic circuit area LR.

Figure 12:
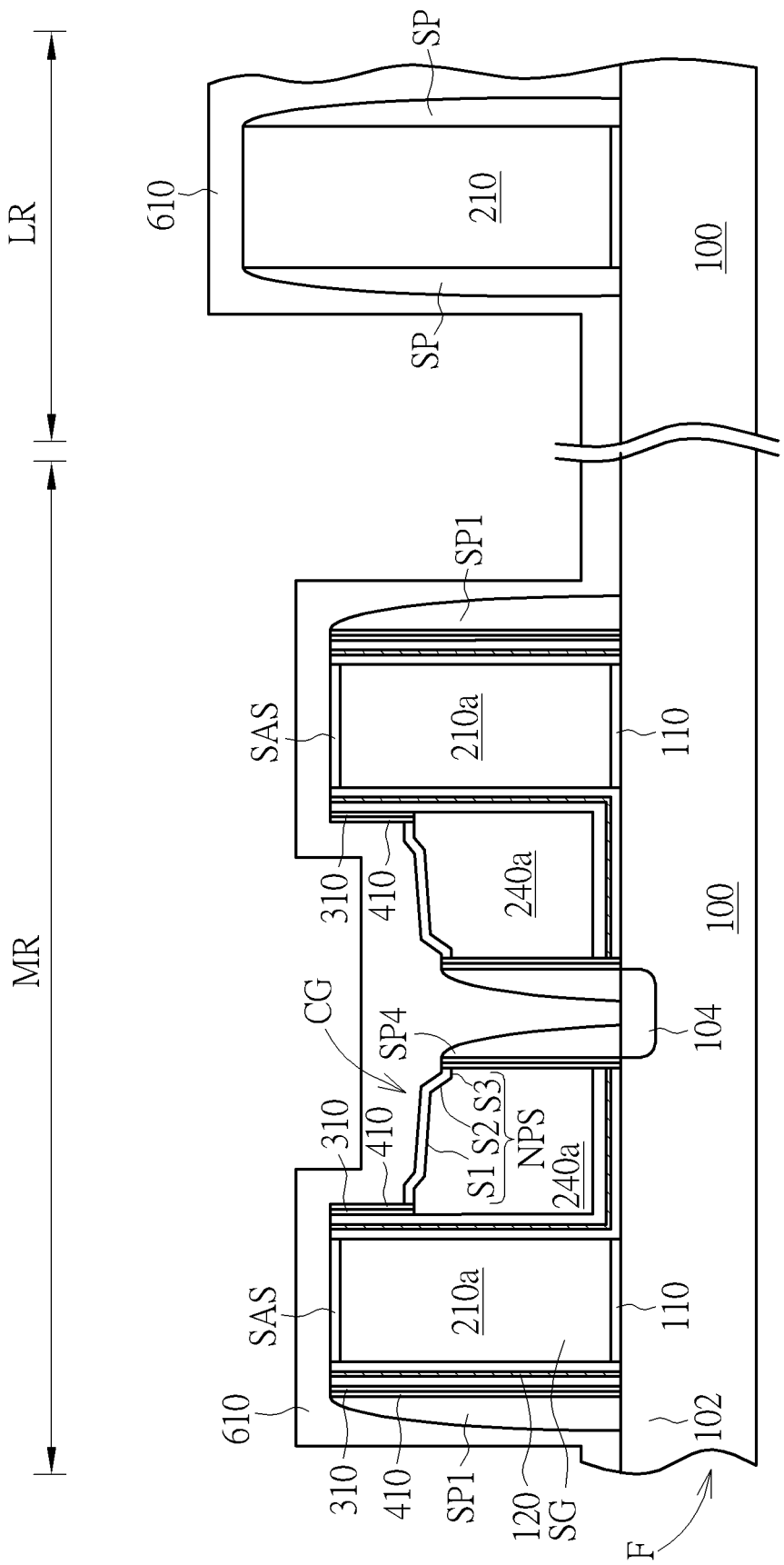
Figure 13:
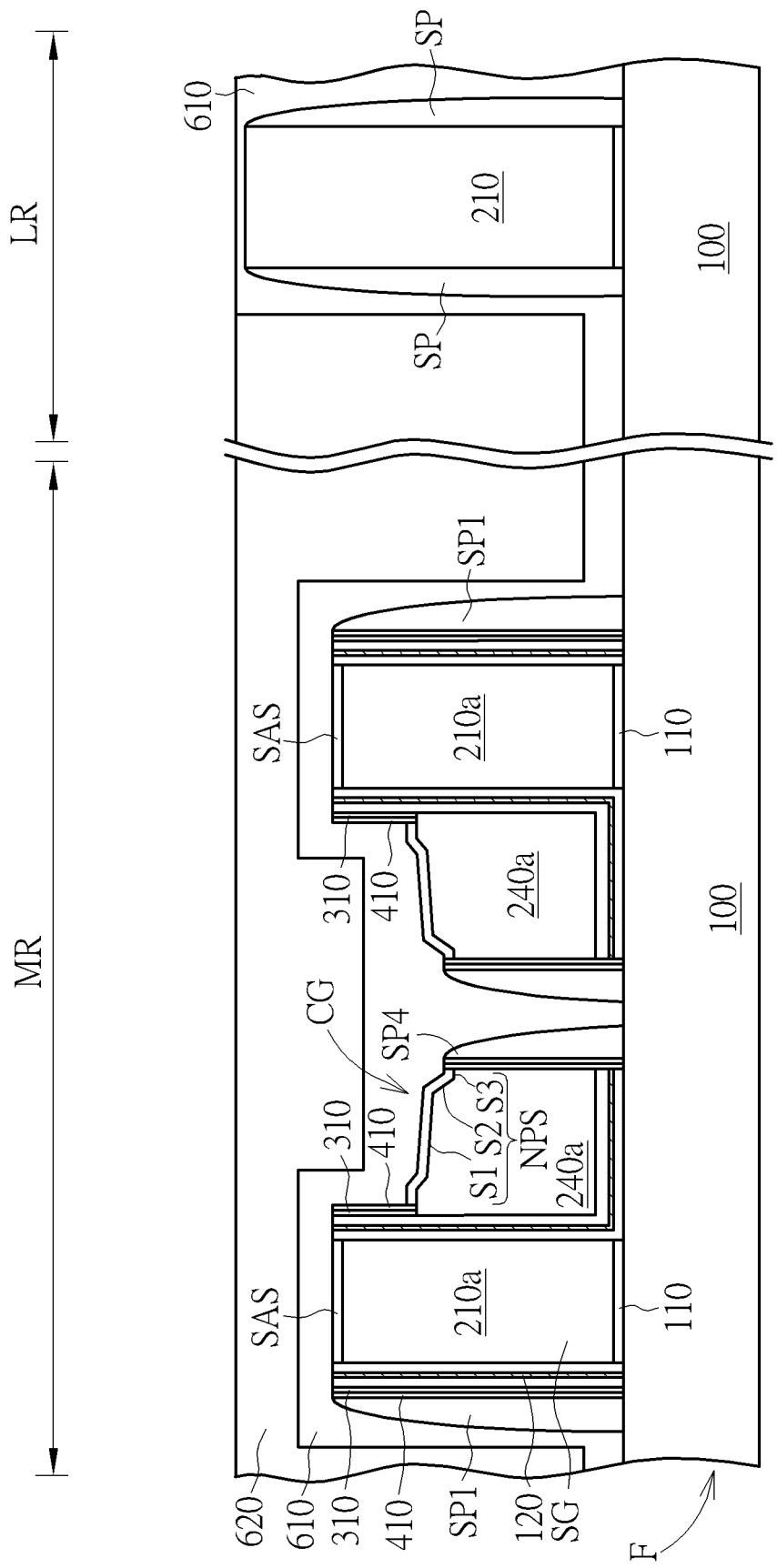
Figure 14:
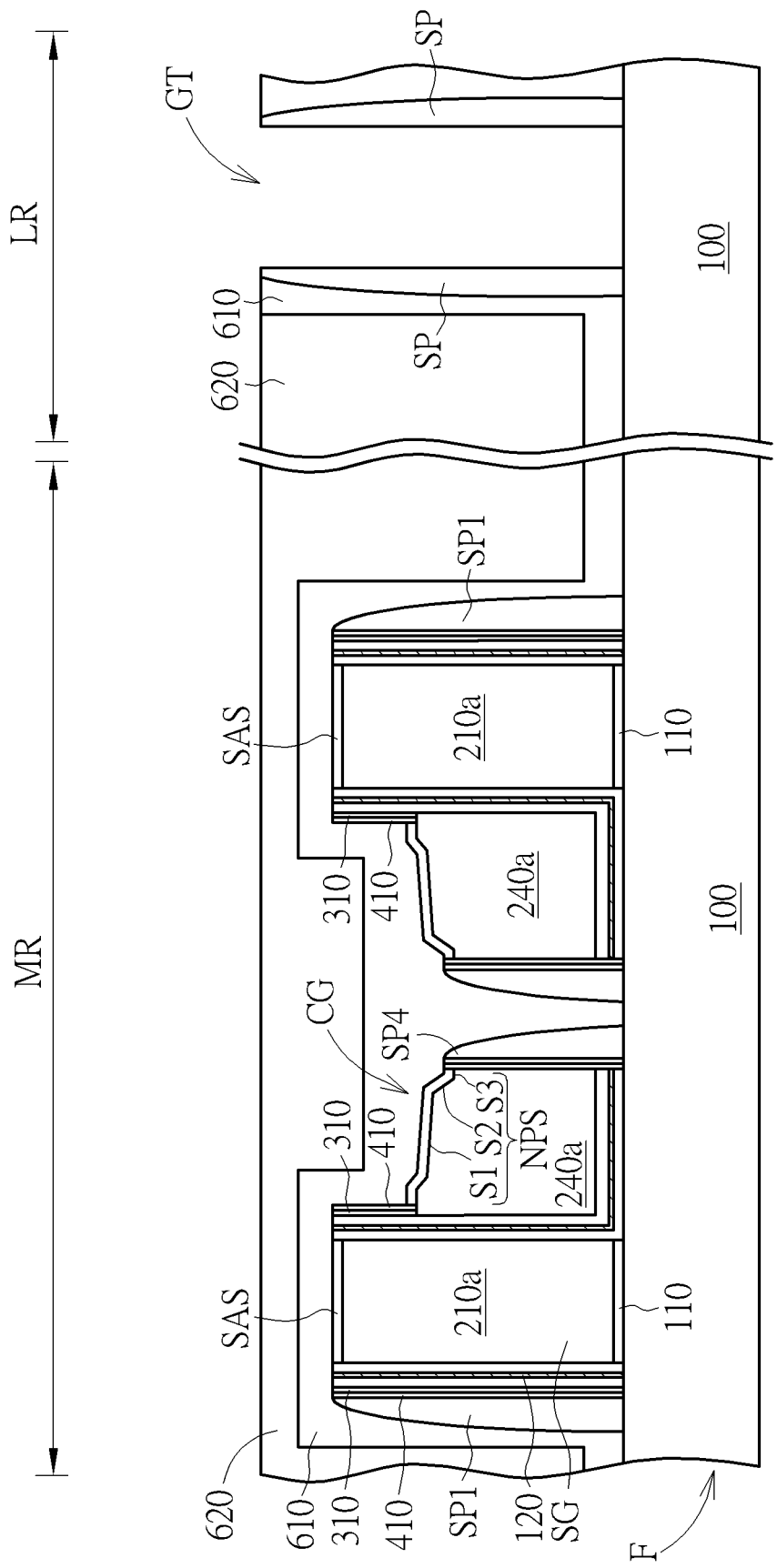
Figure 15:
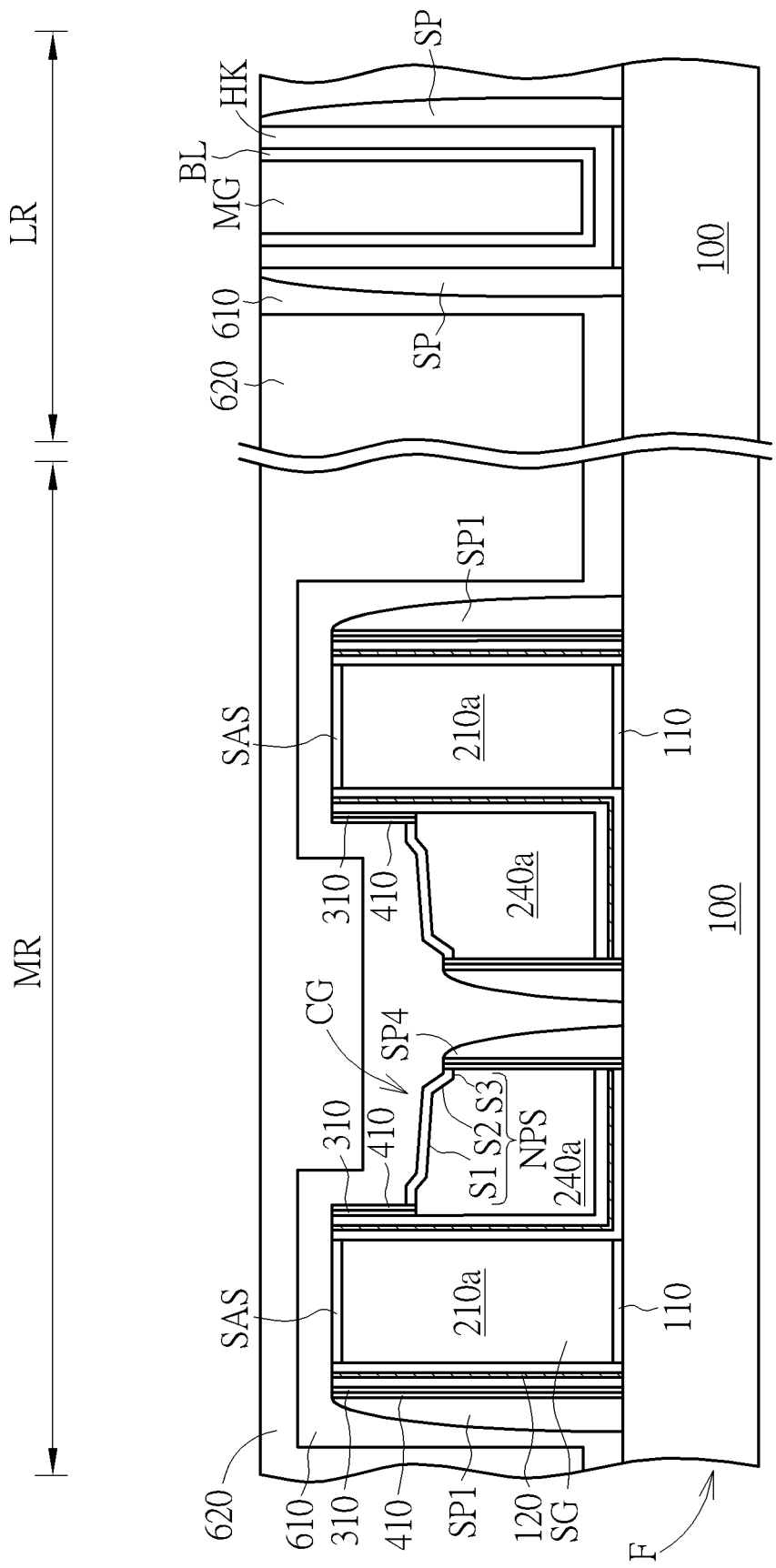

As shown in FIG. 12 to FIG. 15, a replacement metal gate (RMG) process is subsequently performed. For example, as shown in FIG. 12, a chemical vapor deposition process is first performed in the memory region MR and the logic circuit region LR to conformally deposit a contact etch stop layer 610. For example, the contact etch stop layer 610 may be a silicon nitride layer. According to an embodiment of the present invention, the contact etching stop layer 610 may have tensile stress. As shown in FIG. 13, a dielectric layer 620 is then deposited on the contact etch stop layer 610 by using a chemical vapor deposition process, and then the dielectric layer 620 is planarized by using a chemical mechanical polishing (CMP) process. Subsequently, as shown in FIG. 14, the dummy gate structure DP in the logic circuit area LR is removed to form a gate trench GT. Finally, as shown in FIG. 15, gate materials such as a high dielectric constant layer HK, a barrier layer BL, and a low resistance metal layer MG are sequentially formed in the gate trench GT.

It is one technical feature of the present invention that the select gate SG is formed first, and then the charge storage layer 120 is formed, and then the control gate CG is formed in a self-aligned manner. In this way, a photomask can be saved, cost is reduced, and the control gate CG is formed in a self-aligned manner, which can solve the problems of overlay shift and insufficient read/write operation margin of the memory.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A semiconductor memory device, comprising:
a semiconductor substrate;
a select gate disposed on the semiconductor substrate, wherein the select gate comprises a first sidewall and a second sidewall opposite to the first sidewall;
a control gate disposed on the semiconductor substrate and in proximity to the second sidewall of the select gate, wherein the control gate comprises a third sidewall in proximity to the second sidewall, a fourth sidewall opposite to the third sidewall, and a non-planar top surface between the third sidewall and the fourth sidewall, wherein the non-planar top surface descending from the third sidewall to the fourth sidewall, wherein the first surface region, wherein the non-planar top surface comprises a first surface region between the third sidewall and the fourth sidewall and a second surface region between the first surface and the fourth sidewall, and wherein a slope of the second surface region is greater than that of the first surface region, and wherein the first surface region and the second surface region are covered with a metal silicide layer; and
a charge storage layer disposed between the control gate and the semiconductor substrate, wherein the charge storage layer extends onto the second sidewall, wherein the charge storage layer covers an entire surface of the second sidewall and protrudes from a top surface of the metal silicide layer, and wherein an outer surface of the charge storage layer above the control gate is covered with a spacer, wherein the spacer does not extend onto a top surface of the charge storage layer, wherein the metal silicide layer is disposed on the non-planar top surface not covered by the spacer.

2. The semiconductor memory device according to claim 1, wherein the substrate comprises a fin structure extending along a first direction.

3. The semiconductor memory device according to claim 2, wherein the select gate extends along a second direction and crosses over the fin structure.

4. The semiconductor memory device according to claim 3, wherein the control gate extends along the second direction and crosses over the fin structure.

5. The semiconductor memory device according to claim 1, wherein the non-planar top surface further comprises a third surface region connecting the second surface region with the fourth sidewall, wherein the second surface region, the third surface region and the fourth sidewall constitute a step structure.

6. The semiconductor memory device according to claim 5, wherein the third surface region is lower than the first surface region and the second surface region.

7. The semiconductor memory device according to claim 1, wherein the select gate is a polysilicon electrode.

8. The semiconductor memory device according to claim 1, wherein the control gate is a polysilicon electrode.

9. The semiconductor memory device according to claim 1, wherein the charge storage layer is an oxide-nitride-oxide (ONO) layer.

10. A method for forming a semiconductor memory device, comprising:
providing a semiconductor substrate;
forming a select gate on the semiconductor substrate, wherein the select gate comprises a first sidewall and a second sidewall opposite to the first sidewall;
forming a control gate in a self-aligned manner on the semiconductor substrate and in proximity to the second sidewall of the select gate, wherein the control gate comprises a third sidewall in proximity to the second sidewall, a fourth sidewall opposite to the third sidewall, and a non-planar top surface between the third sidewall and the fourth sidewall, wherein the non-planar top surface descending from the third sidewall to the fourth sidewall, wherein the non-planar top surface comprises a first surface region between the third sidewall and the fourth sidewall and a second surface region between the first surface and the fourth sidewall, and wherein a slope of the second surface region is greater than that of the first surface region, and wherein the first surface region and the second surface region are covered with a metal silicide layer; and
forming a charge storage layer between the control gate and the semiconductor substrate, wherein the charge storage layer extends onto the second sidewall, wherein the charge storage layer covers an entire surface of the second sidewall and protrudes from a top surface of the metal silicide layer, and wherein an outer surface of the charge storage layer above the control gate is covered with a spacer, wherein the spacer does not extend onto a top surface of the charge storage layer, wherein the metal silicide layer is disposed on the non-planar top surface not covered by the spacer.

11. The method according to claim 10, wherein the substrate comprises a fin structure extending along a first direction.

12. The method according to claim 11, wherein the select gate extends along a second direction and crosses over the fin structure.

13. The method according to claim 12, wherein the control gate extends along the second direction and crosses over the fin structure.

14. The method according to claim 10, wherein the non-planar top surface further comprises a third surface region connecting the second surface region with the fourth sidewall, wherein the second surface region, the third surface region and the fourth sidewall constitute a step structure.

15. The method according to claim 14, wherein the third surface region is lower than the first surface region and the second surface region.

16. The method according to claim 10, wherein the select gate is a polysilicon electrode.

17. The method according to claim 10, wherein the control gate is a polysilicon electrode.

18. The method according to claim 10, wherein the charge storage layer is an oxide-nitride-oxide (ONO) layer.

* * * * *